(12) United States Patent
Schoepp et al.

(10) Patent No.: US 6,170,429 B1
(45) Date of Patent: Jan. 9, 2001

(54) CHAMBER LINER FOR SEMICONDUCTOR PROCESS CHAMBERS

(75) Inventors: Alan M. Schoepp, Ben Lomond; William M. Denty, Jr., San Jose; Michael Barnes, San Ramon, all of CA (US)

(73) Assignee: Lam Research Corporation, Fremont, CA (US)

( * ) Notice: Under 35 U.S.C. 154(b), the term of this patent shall be extended for 0 days.

(21) Appl. No.: 09/163,722

(22) Filed: Sep. 30, 1998

(51) Int. Cl.$^7$ .................................................. C23C 16/00
(52) U.S. Cl. ...................... 118/723 R; 156/345; 118/504
(58) Field of Search ................. 156/345; 118/723 R, 118/728, 504, 715, 723 E, 723 ER, 723 I, 723 IR, 723 AN, 723 MW, 723 MR, 723 MA, 723 ME; 204/298.11

(56) References Cited

U.S. PATENT DOCUMENTS

| 5,348,587 | | 9/1994 | Eichman et al. . |
| 5,605,637 | | 2/1997 | Shan et al. . |
| 5,641,375 | | 6/1997 | Nitescu et al. . |
| 5,851,299 | * | 12/1998 | Cheng et al. ......................... 118/729 |
| 5,882,411 | * | 3/1999 | Zhas et al. ............................ 118/715 |
| 5,900,064 | * | 5/1999 | Kholodenko ...................... 118/723 R |
| 5,951,775 | * | 9/1999 | Tepman ................................ 118/729 |
| 5,964,947 | * | 10/1999 | Zhao et al. ........................... 118/715 |
| 5,976,308 | * | 11/1999 | Fairbairn et al. .................... 156/345 |
| 5,977,519 | * | 11/1999 | Sorensen et al. .................... 219/402 |

FOREIGN PATENT DOCUMENTS 0 814 495 A2   12/1997  (EP) .

* cited by examiner

Primary Examiner—Gregory Mills
Assistant Examiner—Luz Alejandro
(74) Attorney, Agent, or Firm—Martine Penilla & Kim, LLP

(57) ABSTRACT

A chamber liner for use in a semiconductor process chamber and a semiconductor process chamber containing the chamber liner are disclosed. The process chamber includes a housing having an inner surface defining a chamber in which a vacuum is drawn during processing of a semiconductor wafer. The chamber liner has a plasma confinement shield with a plurality of apertures. An outer sidewall extends upwardly from the plasma confinement shield. An outer flange extends outwardly from the outer sidewall such that the outer flange extends beyond the chamber and into a space at atmospheric pressure. The chamber liner preferably further includes an inner sidewall that extends upwardly from the plasma confinement shield. The plasma confinement shield, the inner and outer sidewalls, and the outer flange are preferably integral with one another.

15 Claims, 9 Drawing Sheets

CHAMBER LINER FOR SEMICONDUCTOR PROCESS CHAMBERS

BACKGROUND OF THE INVENTION

The present invention relates generally to semiconductor fabrication and, more particularly, to a chamber liner for use in semiconductor process chambers.

In semiconductor fabrication, plasma etching is commonly used to etch conductive and dielectric materials. One of the problems with plasma etching is that a film builds up on the wall of the process chamber over the course of time as multiple wafers are processed in the chamber. This film build-up may cause problems in either of two ways. First, the film may flake off the wall and introduce particulates into the chamber. As feature sizes in integrated circuit devices continue to decrease, the degree to which particulates can be tolerated during processing is rapidly declining. Therefore, it is becoming increasingly more important to avoid particulates during processing. Second, the film may alter the RF ground path and thereby affect the results obtained on the wafer. The occurrence of either of these conditions is undesirable and signals the need to subject the process chamber to a wet cleaning operation in which the wall of the chamber is physically scrubbed to remove the film build-up.

Wet cleaning of process chambers is not preferred in commercial semiconductor fabrication because it requires that a process module be taken off-line and thereby reduces throughput. In an effort to avoid the need for wet cleaning, some process chambers have been provided with a liner for protecting the wall of the chamber. The use of a liner is advantageous because the liner can be easily replaced with minimal downtime when film build-up occurs thereon.

Cylindrical liners currently used in process chambers, however, suffer from at least two major drawbacks. The first drawback is that such a liner, the entirety of which is located in a vacuum, lacks an adequate thermal connection because thermal transfer in a vacuum is poor. As a result, the temperature of the liner fluctuates dramatically when the RF power is cycled on and off. This temperature fluctuation causes undesirable variations in the processing of the wafer. The second drawback is that it is difficult to make an electrical connection to the liner in the vacuum that provides a satisfactory RF ground return path. The materials commonly used for this purpose, e.g., stainless steel screws, copper strapping, and beryllium copper fingers, produce contaminants on the wafer because they are not compatible with the reactive materials within the chamber, i.e., the plasma chemistry.

In view of the foregoing, there is a need for a chamber liner for a semiconductor process chamber that provides thermal stability, an adequate RF ground return path, and serviceability with minimal downtime.

SUMMARY OF THE INVENTION

Broadly speaking, the invention fills this need by providing an upper chamber liner that is configured to provide thermal stability, a gridded design that serves as a RF ground return path, and easy removal for cleaning. The invention also provides a process chamber for use in semiconductor fabrication that includes the upper chamber liner of the invention.

In one aspect of the invention, a process chamber for use in semiconductor fabrication is provided. The process chamber includes a housing having an inner surface defining a chamber in which a vacuum is drawn during processing of a semiconductor wafer. The process chamber further includes an upper chamber liner having a plasma confinement shield with a plurality of apertures. An outer sidewall extends upwardly from the plasma confinement shield. An outer flange extends outwardly from the outer sidewall such that the outer flange extends beyond the chamber and into a space at atmospheric pressure. The upper chamber liner preferably further includes an inner sidewall that extends upwardly from the plasma confinement shield. The plasma confinement shield, the inner and outer sidewalls, and the outer flange are preferably integral with one another. The process chamber still further includes a lower chamber liner that protects the inner surface of the housing that is not covered by the upper chamber liner.

In one preferred embodiment, the plasma confinement shield has an annular configuration that defines an inner circumference and an outer circumference. In this preferred embodiment, the outer and inner sidewalls are cylindrical. The cylindrical outer sidewall extends upwardly from the outer circumference for a first distance and is preferably substantially perpendicular to the plasma confinement shield. The cylindrical inner sidewall extends upwardly from the inner circumference for a second distance, which is shorter than the first distance, and is preferably substantially perpendicular to the plasma confinement shield. If desired, the cylindrical inner sidewall may include an inner flange that extends inwardly in a direction substantially opposite to the direction in which the outer flange extends.

The upper chamber liner is preferably mounted in the process chamber such that a first RF gasket is in contact with the upper surface of the outer flange and a second RF gasket is in contact with a lower surface of the outer flange. When the upper chamber liner is formed of anodized aluminum, the first and second RF gaskets are in contact with portions of the upper and lower surfaces of the outer flange, respectively, that are substantially free of anodization.

In accordance with another aspect of the invention, a chamber liner for use in a process chamber used in semiconductor fabrication is provided. The chamber liner includes a plasma confinement shield having a plurality of apertures. An outer sidewall, which is preferably integral with the plasma confinement shield, extends upwardly from the plasma confinement shield. An outer flange, which is preferably integral with the outer sidewall, extends outwardly from the outer sidewall. The outer flange is configured to extend beyond an internal vacuum region of a process chamber and into a space at atmospheric pressure. The chamber liner preferably further includes an inner sidewall that extends upwardly from the plasma confinement shield. The inner sidewall is preferably integral with the plasma confinement shield.

In one preferred embodiment, the plasma confinement shield has an annular configuration that defines an inner circumference and an outer circumference. In this preferred embodiment, the outer and inner sidewalls are cylindrical. The cylindrical outer sidewall extends upwardly from the outer circumference for a first distance and is preferably substantially perpendicular to the plasma confinement shield. The cylindrical inner sidewall extends upwardly from the inner circumference for a second distance, which is shorter than the first distance, and is preferably substantially perpendicular to the plasma confinement shield. If desired, the cylindrical inner sidewall may include an inner flange that extends inwardly in a direction substantially opposite to the direction in which the outer flange extends.

The chamber liner is preferably formed of anodized aluminum. To enable the chamber liner to be electrically grounded to the housing of a process chamber, the upper and lower surfaces of the outer flange are provided with areas for receiving RF gaskets that are substantially free of anodization.

The chamber liner, i.e., the upper chamber liner, of the invention provides a number of significant technical advantages. Because the outer flange extends beyond the chamber and into the atmosphere, the chamber liner can be electrically grounded to the housing of the process chamber using known RF gasket materials without producing contaminants on the wafer. The outer flange also provides the chamber liner with thermal stability by increasing the thermal conductivity of the liner. This minimizes the fluctuation in temperature that occurs in the chamber liner when the RF power is cycled on and off. Another advantage is that continuous RF gaskets can be used to electrically connect the outer flange to the housing of the process chamber. The use of continuous RF gaskets is advantageous because it provides better electrical contact than the use of discrete bolts. Yet another advantage is that the integral, i.e., one-piece, configuration of the chamber liner makes the liner easy to remove from the process chamber and easy to clean. The ease with which the chamber liner can be removed and cleaned helps to increase wafer throughput by minimizing downtime.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

FIG. 4b illustrates the apertures provided in the plasma confinement shield in accordance with one embodiment of the invention. The apertures are provided in the entirety of the plasma confinement shield; however, for ease of illustration, the apertures are shown only in a limited region of the plasma confinement shield, i.e., region 130 indicated by the dashed line in FIG. 4a.

FIG. 4c illustrates the apertures provided in the plasma confinement shield in accordance with another embodiment of the invention. The apertures are provided in the entirety of the plasma confinement shield; however, for ease of illustration, the apertures are shown only in a limited region of the plasma confinement shield, i.e., region 130 indicated by the dashed line in FIG. 4a.

DETAILED DESCRIPTION OF THE PREFERRED EMBODIMENTS

Reference will now be made to the present preferred embodiments of the invention, examples of which are illustrated in the accompanying drawings.

Figure 1:
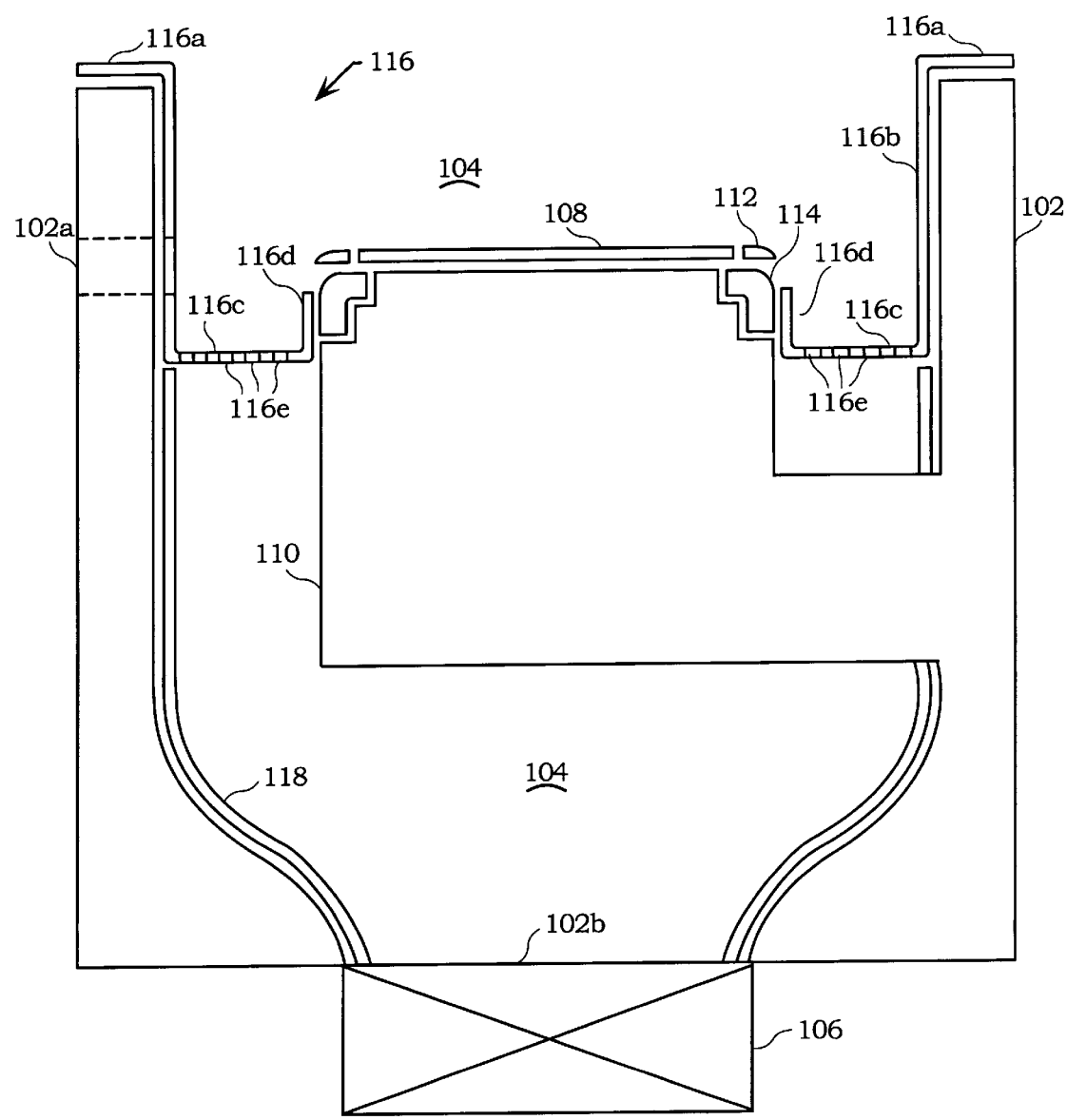
FIG. 1 is a simplified schematic representation of a cross section of a semiconductor process chamber provided with a chamber liner in accordance with one embodiment of the invention.

FIG. 1 is a simplified schematic representation of a cross section of a semiconductor process chamber provided with a chamber liner in accordance with one embodiment of the invention. As shown in FIG. 1, process chamber 100, e.g., a high-density plasma etching chamber, includes housing 102 having ports 102a and 102b. The inner surface of housing 102 defines a chamber 104 in which a vacuum is drawn during wafer processing by vacuum pump 106 connected to port 102b. Wafer 108, which may be loaded into chamber 104 through port 102a, is disposed over electrostatic chuck and housing member 110 during processing thereof. Insert focus ring 112, which is supported by base focus ring 114, surrounds wafer 108 as is well known to those skilled in the art. The inner surface of housing 102 is covered by the combination of upper liner 116 and lower liner 118, the details of which are set forth in the following discussion.

Upper liner 116 includes outer flange 116a, outer sidewall 116b, plasma confinement shield 116c, and inner sidewall 116d. Plasma confinement shield 116c is provided with a plurality of apertures 116e and serves to confine the plasma to the upper region of chamber 104, i.e., the portion of chamber 104 above plasma confinement shield 116c, as will be described in more detail below. Outer sidewall 116b extends upwardly from plasma confinement shield 116c and generally conforms to the inner surface of housing 102. As such, outer sidewall 116b collects the polymer residue generated during wafer processing and thereby serves as a protective barrier for the portion of the inner surface of housing 102 covered thereby. Outer flange 116a extends outwardly from outer sidewall 116b such that a substantial portion of outer flange 116a extends beyond chamber 104 and into a space at atmospheric pressure. Inner sidewall 116d extends upwardly from plasma confinement shield 116c and serves to promote coupling efficiency to wafer 108, as will be explained in more detail below. Lower liner 118, which generally conforms to the inner surface of housing 102, collects the polymer residue generated during wafer processing and thereby serves as a protective barrier for the portion of the inner surface of housing 102 covered thereby.

The function of outer flange 116a is to bring upper liner 116 out from within chamber 104, which is under vacuum during processing, and into contact with the atmosphere. By virtue of outer flange 116a being in contact with the atmosphere, the thermal conductivity of upper liner 116 is increased because thermal transfer is more efficient in the atmosphere than in a vacuum. This increased thermal conductivity provides upper liner 116 with thermal stability so that the temperature of the liner 116 does not significantly fluctuate due to the heat flux from the plasma when the RF power is cycled on and off. In addition to providing thermal stability, outer flange 116a also enables liner 116 to be electrically ground to housing 102 without producing contaminants on wafer 108. In particular, liner 116 may be electrically ground to housing 102 by disposing outer flange 116a between two RF gaskets, as will be described in more detail below. The RF gaskets are not exposed to the plasma chemistry within chamber 104 because outer flange 116a extends outside of the chamber. Consequently, the RF gaskets do not produce contaminants on wafer 108, even if they are formed of a material that is incompatible with the plasma chemistry within chamber 104.

Figure 2A:
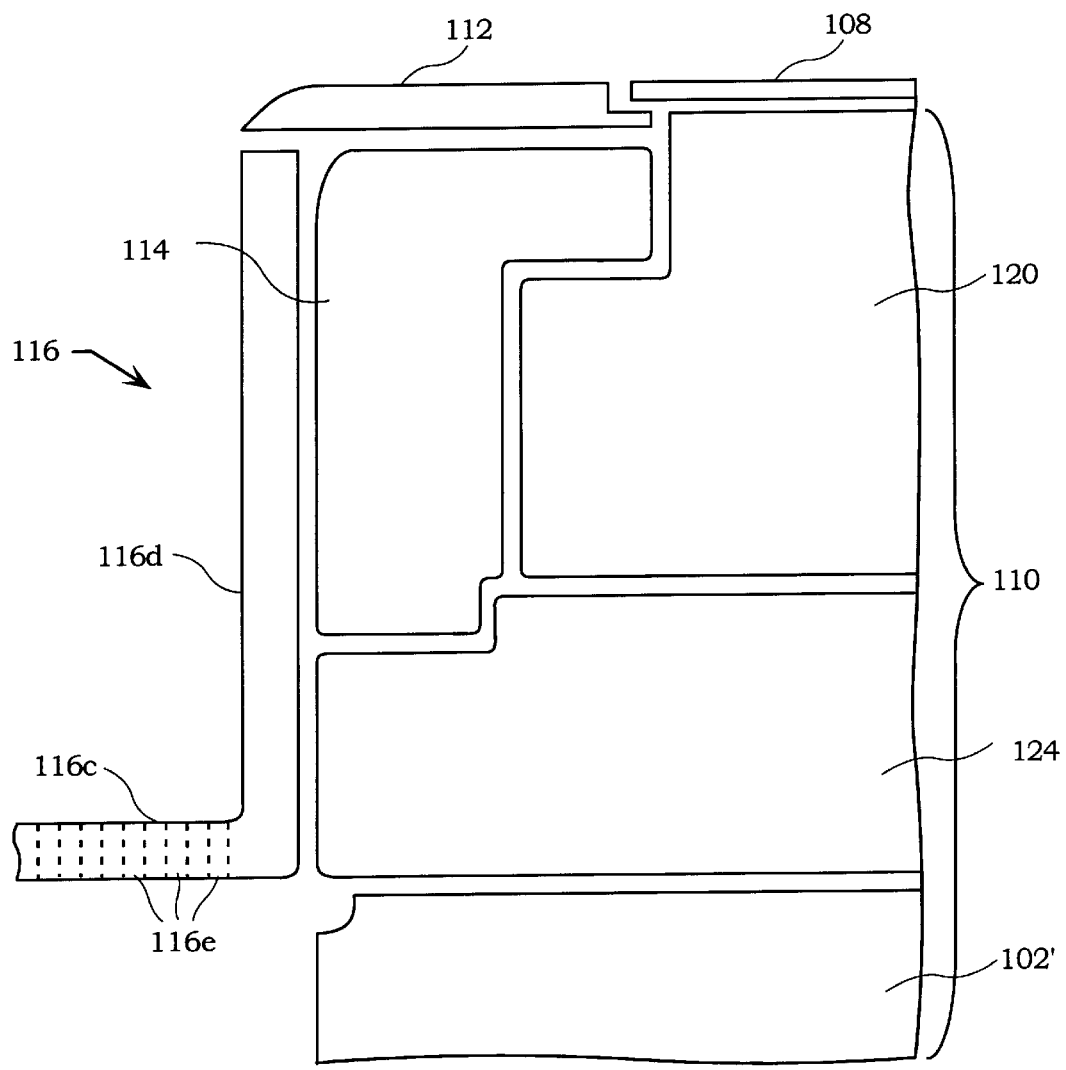
FIG. 2a illustrates in more detail the configuration of the inner sidewall of the chamber liner in accordance with one embodiment of the invention.

FIG. 2a illustrates in more detail the configuration of inner sidewall 116d of upper liner 116 in accordance with one embodiment of the invention. As shown in FIG. 2a, electrostatic chuck and housing member 110, which is shown generally as a single component in FIG. 1, includes electrostatic chuck 120, which may be provided with a backside cooling and pressure unit, lower insulator 124, and electrode housing 102', which is an extension of housing 102. When RF power is applied to electrostatic chuck 120, the RF power must be efficiently directed up through wafer 108. Inner sidewall 116d acts as a shield, e.g., a Faraday shield, for electrostatic chuck 120 and thereby prevents the RF power from coupling with the plasma and other loss paths. As a result, inner sidewall 116d advantageously promotes coupling efficiency to wafer 108. As shown in FIG. 2a, the top of inner sidewall 116d is located slightly below wafer 108. This relative positioning may be varied, however, so that the top of inner sidewall 116d is either even with or slightly above wafer 108.

Figure 2B:
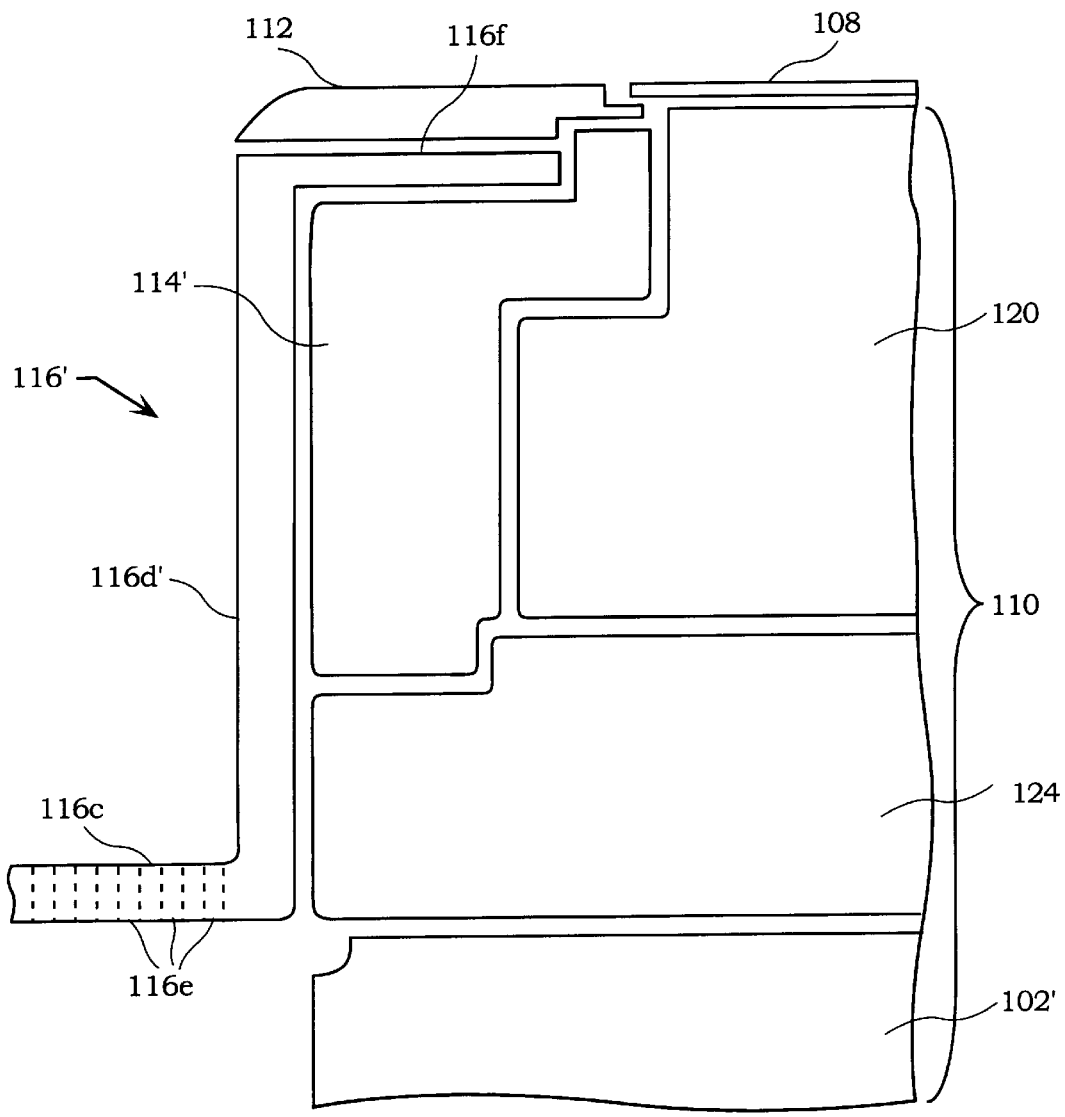
FIG. 2b illustrates in more detail the configuration of the inner sidewall of the chamber liner in accordance with another embodiment of the invention.

FIG. 2b illustrates in more detail the configuration of inner sidewall 116d' of upper liner 116' in accordance with another embodiment of the invention. In this embodiment inner sidewall 116d' includes inner flange 116f. As shown in FIG. 2b, inner flange 116f extends inwardly from inner sidewall 116d' toward electrostatic chuck and housing member 110. Relative to inner sidewall 116d shown in FIG. 1, inner sidewall 116d' may be a more effective shield to RF loss because inner flange 116f blocks any substantial coupling of the RF power with the plasma that may occur through insert focus ring 112. The configuration of base focus ring 114' shown in FIG. 2b has been modified relative to that of base focus ring 114 shown in FIG. 2a to accommodate inner flange 116f.

Figure 3A:
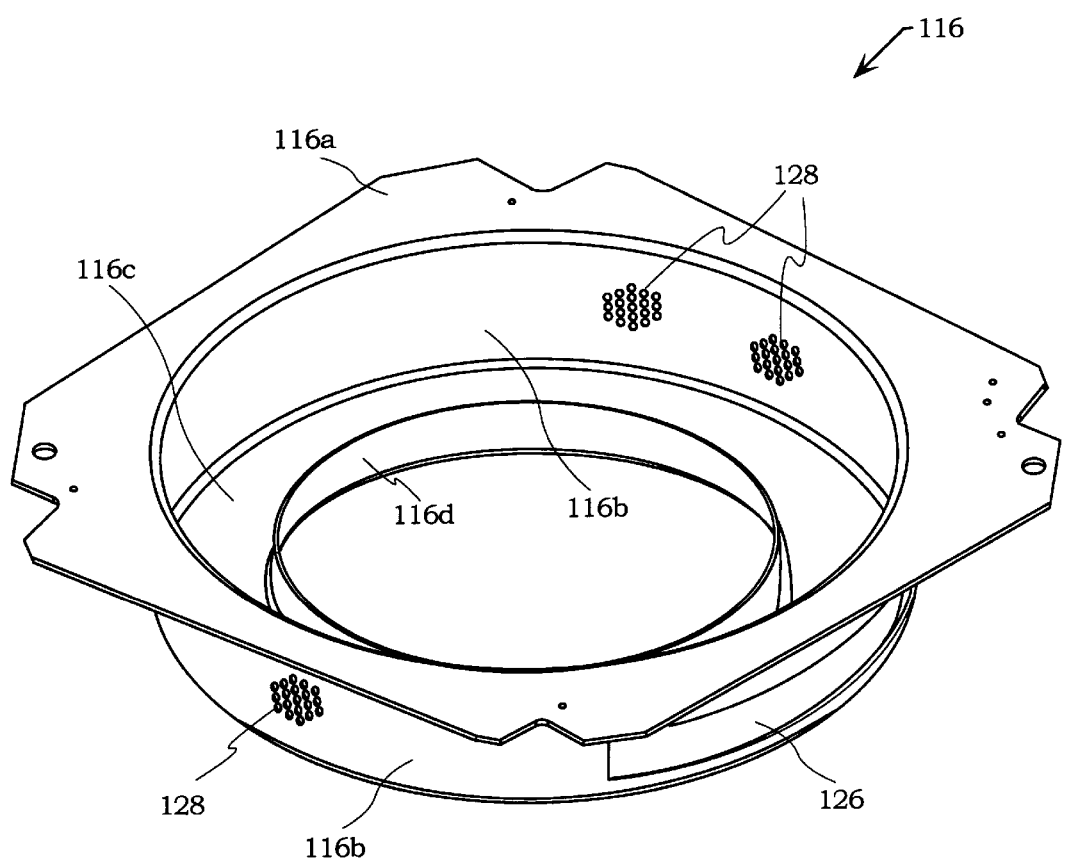
FIG. 3a shows a three-dimensional view of the chamber liner in accordance with one embodiment of the invention.

FIG. 3a shows a three-dimensional view of upper liner 116 in accordance with one embodiment of the invention. As shown in FIG. 3a, plasma confinement shield 116c has an annular configuration defining an inner circumference and an outer circumference. In this simplified illustration, apertures 116e (see, e.g., FIG. 1) in plasma confinement shield 116 have been omitted for the sake of clarity. Outer sidewall 116b is cylindrical and extends upwardly from plasma confinement shield 116c at the outer circumference thereof for a first distance. Inner sidewall 116d is cylindrical and extends upwardly from plasma confinement shield 116c at the inner circumference thereof for a second distance, which is shorter than the first distance. Both outer sidewall 116b and inner sidewall 116d are preferably substantially perpendicular to plasma confinement shield 116c.

As shown in FIG. 3a, outer sidewall 116b is provided with wafer load port 126 and three diagnostic ports 128. Wafer load port 126 enables a wafer to be passed into and out of chamber 104 (see FIG. 1) using a robot arm. Accordingly, wafer load port 126 must be large enough to accommodate the wafer and robot arm. Subject to this constraint, the size of wafer load port 126 is preferably kept to a minimum to avoid disrupting the plasma profile over the wafer. Diagnostic ports 128 may be used to monitor process conditions within chamber 104. For example, diagnostic ports 128 may be used for probing the pressure within chamber 104 or for optically detecting the endpoint in a particular process. As shown in FIG. 3a, diagnostic ports 128 are comprised of a plurality of holes arranged in a hexagonal pattern to confine the plasma within chamber 104. Those skilled in the art will recognize that both the number and the configuration of diagnostic ports 128 may be varied to suit the needs of a particular process.

Outer flange 116a extends outwardly from outer sidewall 116b and is preferably substantially perpendicular thereto. As shown in FIG. 3a, outer flange 116a has a generally rectangular configuration and is provided with a number of cutouts and apertures to facilitate mounting of upper liner 116 in a process chamber. It will be apparent to those skilled in the art that the configuration of outer flange 116a may be varied to accommodate the process chamber in which upper liner 116 is to be used.

Figure 3B:
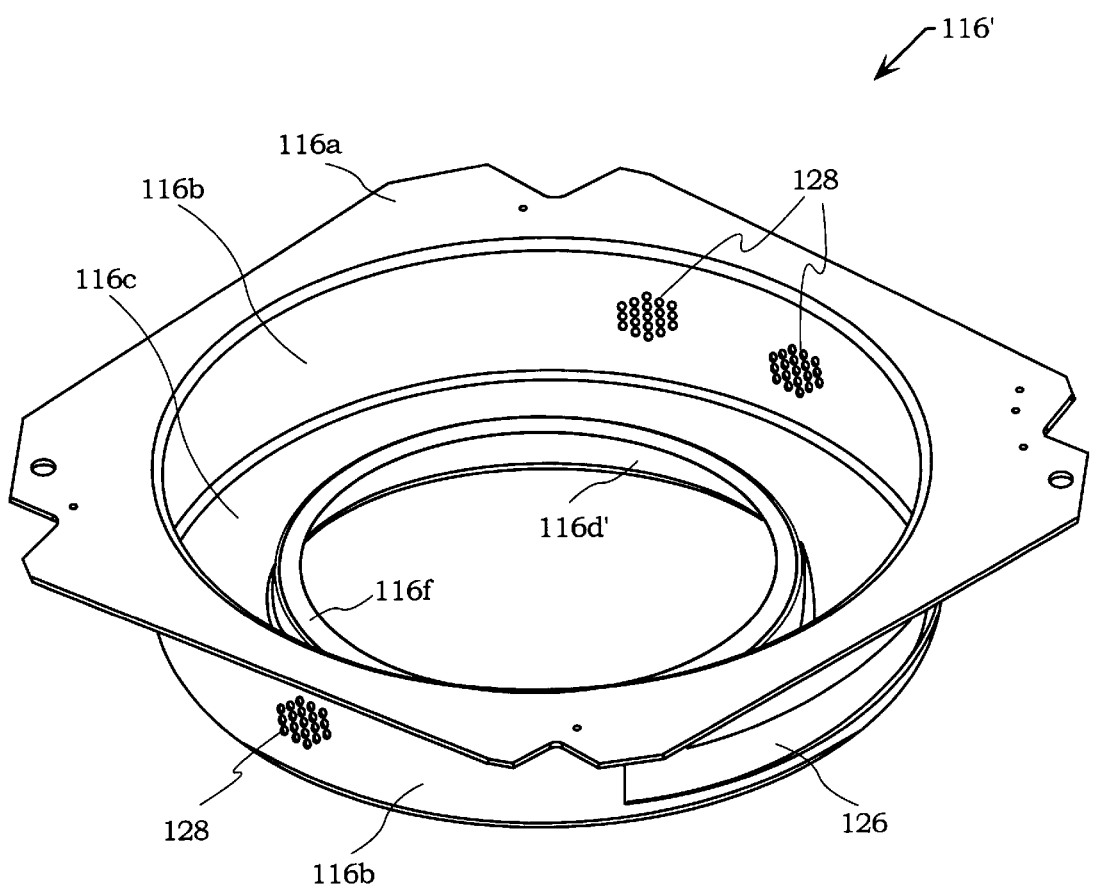
FIG. 3b shows a three-dimensional view of the chamber liner in accordance with another embodiment of the invention.

FIG. 3b shows a three-dimensional view of upper liner 116' in accordance with another embodiment of the invention. Upper liner 116' includes inner sidewall 116d' provided with inner flange 116f that extends inwardly therefrom. The direction in which inner flange 116f extends from inner sidewall 116d' is substantially opposite to the direction in which outer flange 116a extends from outer sidewall 116b. Inner flange 116f is preferably substantially perpendicular to inner sidewall 116d'. As described above in connection with the description of FIG. 2b, inner flange 116f may render inner sidewall 116d' a more effective shield to RF loss than inner sidewall 116d shown in FIG. 3a.

Figure 4A:
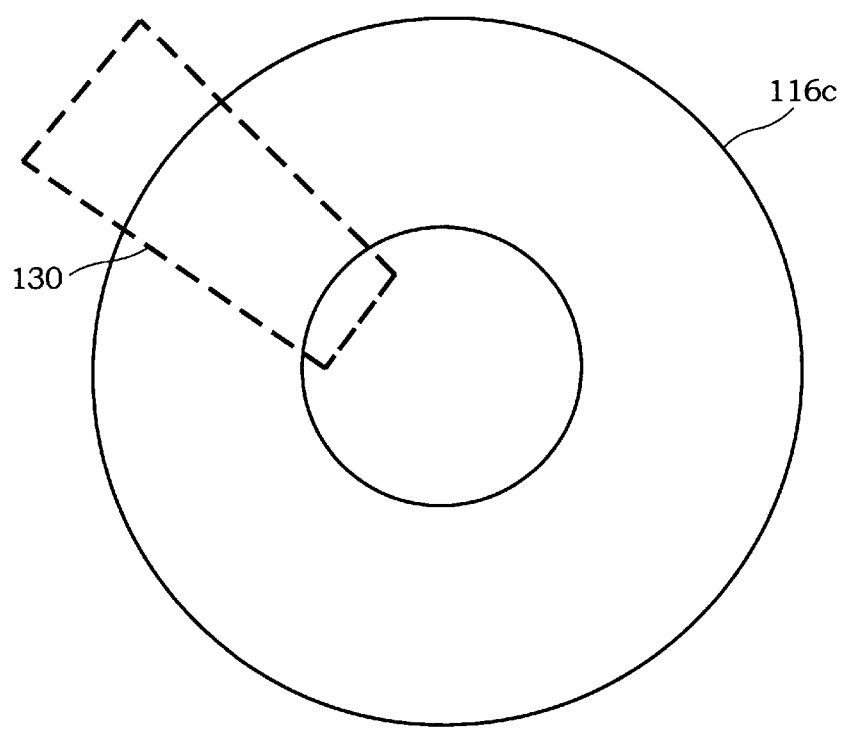
FIG. 4a is a simplified top plan view of the plasma confinement shield of the chamber liner of the invention. In this figure region 130 of the plasma confinement shield is indicated by a dashed line.
Figure 4B:
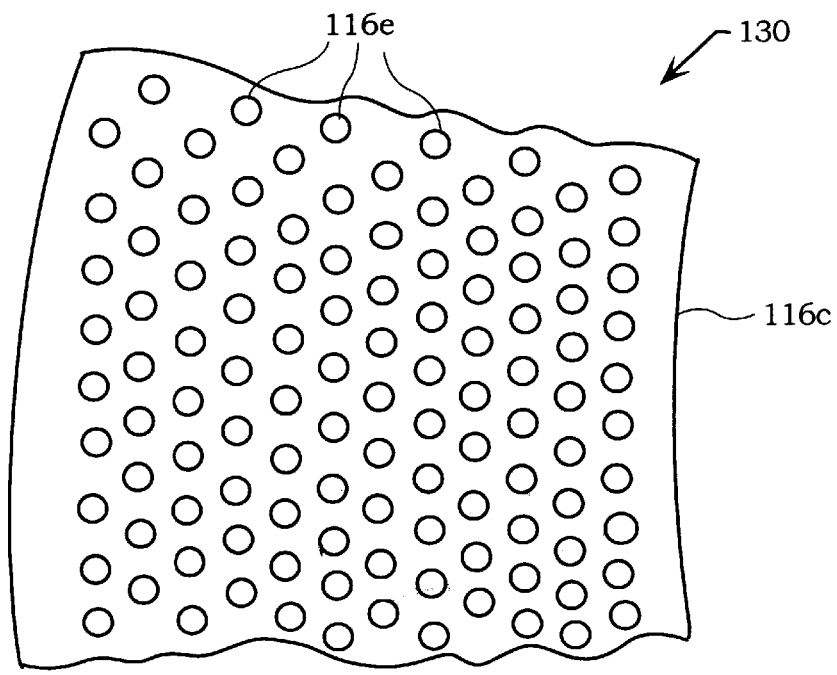
Figure 4C:
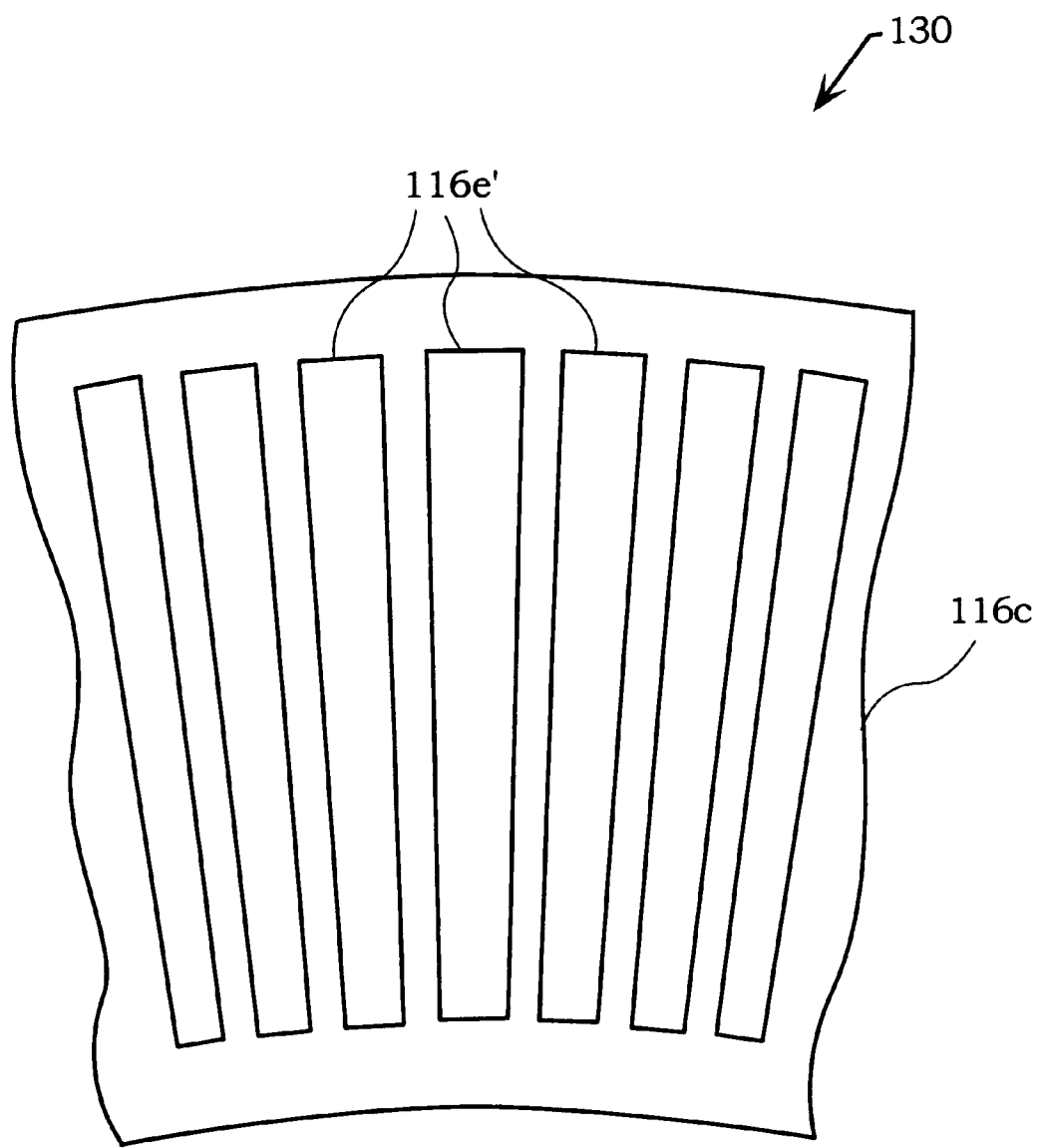

FIGS. 4a–4c illustrate in more detail apertures 116e in plasma confinement shield 116c. FIG. 4a is simplified top plan view of plasma confinement shield 116c in which region 130 is indicated by a dashed line. FIG. 4b illustrates apertures 116e in region 130 of plasma confinement shield 116c in accordance with one embodiment of the invention. As shown in FIG. 4b, apertures 116e are generally circular holes that are arranged in a generally hexagonal pattern. FIG. 4c illustrates apertures 116e' in region 130 of plasma confinement shield 116c in accordance with another embodiment of the invention. As shown in FIG. 4c, apertures 116e' are slots arranged in a radial pattern around plasma confinement shield 116c. The slots are preferably oriented such that their longitudinal axis is substantially perpendicular to the inner and outer circumference of plasma confinement shield 116c. It should be understood that apertures 116e and 116e' are provided in the entirety of plasma confinement shield 116c and not just in region 130 thereof. It will be apparent to those skilled in the art that other gridded designs, i.e., patterns of apertures, may be provided in plasma confinement shield 116c. Moreover, those skilled in the art will appreciate that the gridded design must be configured to balance the conflicting demands of plasma confinement and gas conductance. On the one hand, smaller apertures provide better plasma confinement. On the other hand, larger apertures provide better gas conductance, which is needed to maintain an adequate vacuum in the upper region of chamber 104 (see FIG. 1). In general, any gridded design that provides between about 50% and about 80% of open area in plasma confinement shield 116c is acceptable.

Figure 5:
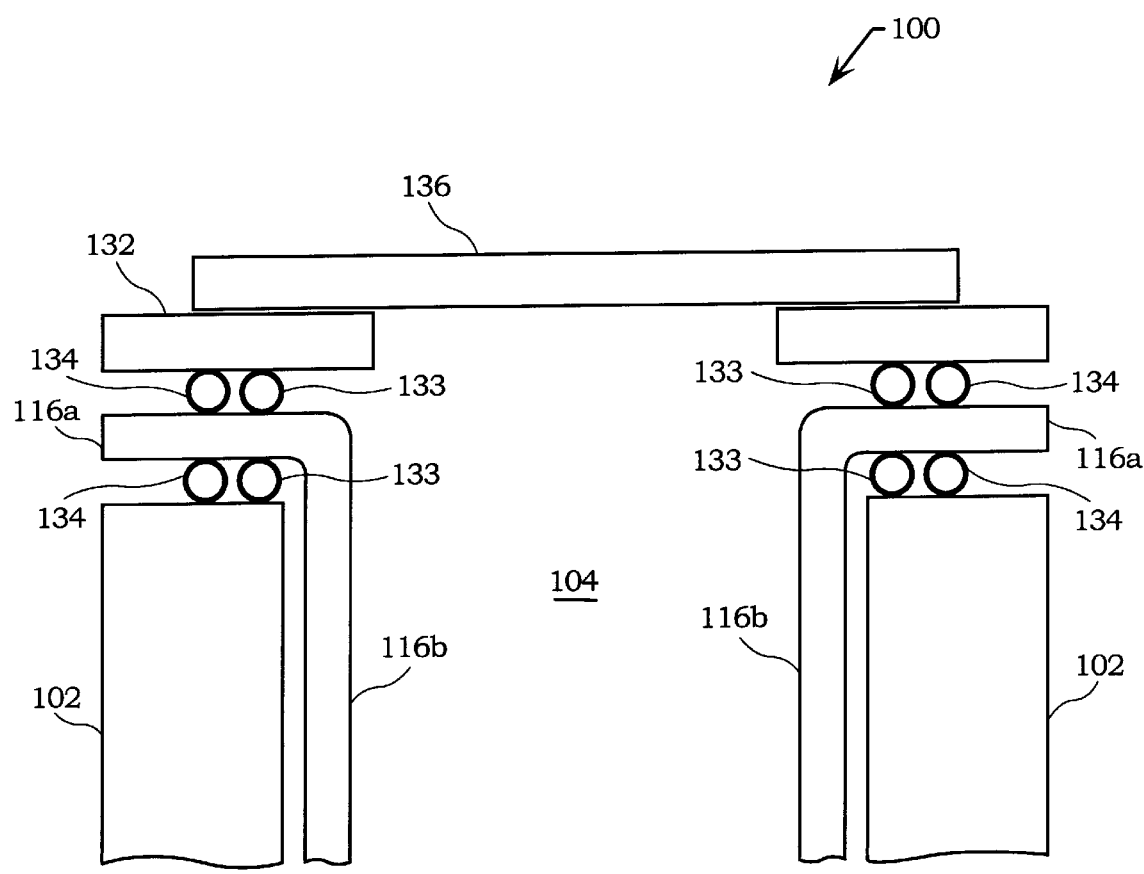
FIG. 5 illustrates the manner in which the chamber liner is mounted in a process chamber in accordance with one embodiment of the invention.

FIG. 5 illustrates the manner in which upper liner 116 is mounted in process chamber 100 in accordance with one embodiment of the invention. As shown in FIG. 5, outer flange 116a is sandwiched between gas distribution plate 132 and the top surface of housing 102. A first vacuum seal 133, e.g., an O-ring, is disposed between the top surface of outer flange 116a and gas distribution plate 132. A second vacuum seal 133 is disposed between the bottom surface of outer flange 116a and the top surface of housing 102. A first RF gasket 134 is disposed outside the diameter of first vacuum seal 133 and between the top surface of outer flange 116a and gas distribution plate 132. A second RF gasket 134 is disposed outside the diameter of second vacuum seal 133 and between the bottom surface of outer flange 116a and the top surface of housing 102. RF gaskets 134 are preferably continuous gaskets so that they provide continuous electrical contact with the top and bottom surfaces of outer flange 116a. Top plate member 136, which may include a RF distribution system, is disposed over gas distribution plate 132 and is electrically grounded thereto.

Upper liner 116 and lower liner 118 are preferably formed of aluminum, and more preferably anodized aluminum. In one preferred embodiment of the invention, the anodized layer has a thickness of about 2–3 mm, which is generally sufficient to prevent the aluminum from substantial attack by the plasma chemistry. For processes involving plasma chemistries that do not significantly attack aluminum, those skilled in the art will appreciate that upper liner 116 and lower liner 118 may be formed of aluminum that has not been anodized. Upper liner 116 and lower liner 118 also may be formed materials other than aluminum including, by way of example, silicon carbide and polyimide materials. Silicon carbide is a desirable material from a processing standpoint, but may be expensive to manufacture. Polymide materials such as, for example, the material sold under the trademark VESPEL by E. I. duPont de Nemours and Company of Wilmington, Del., are also desirable from a processing standpoint, but may not provide an acceptable RF ground return path. RF gaskets 134 may be formed of known RF gasket materials, e.g., beryllium copper.

Figure 6:
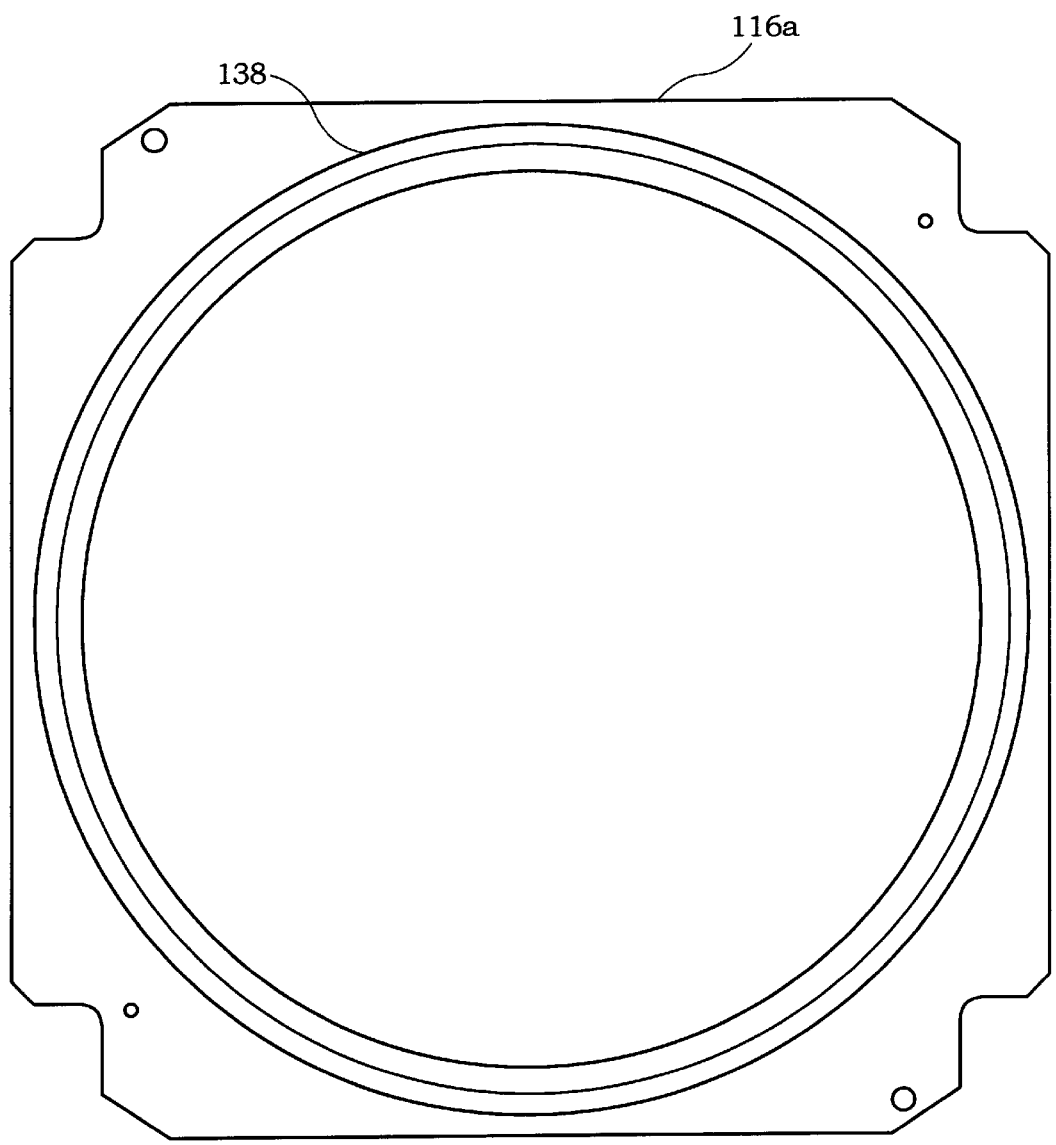
FIG. 6 is a top plan view of the upper surface of the outer flange of a chamber liner formed of anodized aluminum in accordance with one embodiment of the invention. The upper surface of the outer flange is provided with an electrical contact area that is substantially free of anodization.

When upper liner 116 is formed of anodized aluminum, outer flange 116a is preferably provided with electrical contact areas that are substantially free of anodization. FIG. 6 is a top plan view of the upper surface of outer flange 116a in which the entire surface has been anodized except for electrical contact area 138. As shown in FIG. 6, electrical contact area 138 has an annular configuration for receiving a continuous RF gasket. One example of a continuous RF gasket is RF gasket 134, which, as shown in FIG. 5a, is in the form of a ring. A similar electrical contact area is provided on the lower surface of outer flange 116a. The contact between the RF gaskets and electrical contact areas 138 provided on the upper and lower surfaces of outer flange 116a electrically grounds upper liner 116 to housing 102 and gas distribution plate 132. As a consequence of upper liner 116 being grounded to housing 102 and gas distribution plate 132 through outer flange 116a, plasma confinement 116c provides a RF ground return path and thereby serves to confine the plasma to the upper region of chamber 104.

Upper liner 116 and lower liner 118 may be formed in accordance with known metal forming techniques. In one preferred embodiment of the invention, upper liner 116 is formed from a sheet of aluminum using a spinning technique in which a mandrel is used to shape the various portions of the liner, i.e., outer flange 116a, outer sidewall 116b, plasma confinement shield 116c, inner sidewall 116d or 166d', and, if present, inner flange 116f. The spinning technique is desirable because it provides a one-piece upper liner in which the above-described portions of the upper liner are integrally connected to one another without the use of fasteners or other joining techniques, e.g., brazing. Lower liner 118 is also preferably formed as a one-piece liner using the spinning technique.

The upper liner of the invention, which may be used alone or in combination with the lower liner described herein, is well suited for implementation in process chambers provided with a top coil, inductively coupled plasma system, a variety of which, e.g., the TCP 9100™ plasma etch reactor, are available from Lam Research Corporation of Fremont, Calif. Furthermore, the upper liner of the invention, whether used alone or in combination with the lower liner, may be used in process chambers configured for etching of conductive or dielectric materials such as, for example, polysilicon, metals, and oxides. The upper liner of the invention, whether used alone or in combination with the lower liner, also may be used in other semiconductor fabrication equipment where a plasma is used and RF grounding is important, e.g., deposition.

As shown in, e.g., FIGS. 3a and 3b, the height of outer sidewall 116b is greater than the height of inner sidewalls 116d and 116d'. In process chambers with other configurations, e.g., a variable height chuck, it may be desirable to adjust the height of inner sidewall 116d or 116d' to be the same or greater than the height of outer sidewall 116b. In addition, as shown in, e.g., FIGS. 3a and 3b, outer sidewall 116b and inner sidewalls 116d and 116d' are cylindrical. It will be apparent to those skilled in the art that outer sidewall 116b and inner sidewalls 116d and 116d' may have other configurations such as, for example, a conical shape. Additionally, outer flange 116a may be extended to provide more clearance between outer sidewall 116b and the inner surface of housing 102.

The upper liner of the invention constitutes an elegantly simple solution to the RF grounding, thermal stability, and plasma confinement problems presented by conventional cylindrical chamber liners. The outer flange enables the upper liner to be electrically anchored to the housing of a process chamber. As a result, the plasma confinement shield incorporated in the upper liner provides a charge return path for a RF system and thereby serves to confine the plasma within the upper portion of the chamber. The outer flange also provides the upper liner with thermal stability by increasing the thermal conductivity of the liner through exposure to the atmosphere. This helps reduce temperature fluctuations in the upper liner that may adversely affect wafer processing. In addition, the integral, i.e., one-piece, fabrication of the upper liner provides for easy removal and cleaning of the liner. This is beneficial because it increases wafer throughput by minimizing downtime.

In summary, the present invention provides a chamber liner that functions as a protective barrier, as a plasma confinement shield, and as a shield to RF loss to promote the coupling efficiency of RF power to a wafer being processed. The invention has been described herein in terms of several preferred embodiments. Other embodiments of the invention will be apparent to those skilled in the art from consideration of the specification and practice of the invention. For example, as mentioned above, the chamber liner may be formed in multiple sections instead of in one piece as shown and described herein. In addition, as mentioned above, the gridded design of the plasma confinement shield may be modified from that shown and described herein. The embodiments and preferred features described above should be considered exemplary, with the invention being defined by the appended claims.

What is claimed is:

1. A chamber liner for use in a process chamber used in semiconductor fabrication, comprising:

a plasma confinement shield having a plurality of apertures, said plasma confinement shield having an annular configuration defining an inner circumference and an outer circumference, a cylindrical outer sidewall extending upwardly from said outer circumference of said plasma confinement shield for a first distance, a cylindrical inner sidewall extending upwardly from said inner circumference of said plasma confinement shield for a second distance, the first distance being longer than the second distance, and an outer flange extending outwardly from said outer sidewall, said outer flange being configured to extend beyond an internal vacuum region of a process chamber and into a space at atmospheric pressure.

2. The chamber liner of claim 1, wherein the plasma confinement shield, the inner and outer sidewalls, and the outer flange are integral with one another.

3. The chamber liner of claim 1, wherein the inner and outer sidewalls are substantially perpendicular to the plasma confinement shield.

4. The chamber liner of claim 1, wherein the inner sidewall includes an inner flange that extends inwardly in a direction substantially opposite to the direction in which the outer flange extends.

5. The chamber liner of claim 1, wherein the chamber liner is comprised of anodized aluminum, and upper and lower surfaces of the outer flange have portions for contacting RF gaskets that are substantially free of anodization.

6. A chamber liner for use in a process chamber used in semiconductor fabrication, comprising:

a plasma confinement shield having a plurality of apertures, said plasma confinement shield having an annular configuration defining an inner circumference and an outer circumference, a cylindrical outer sidewall integral with said plasma confinement shield and extending upwardly from said outer circumference for a first distance, a cylindrical inner sidewall integral with said plasma confinement shield and extending upwardly from said inner circumference for a second distance, the first distance being longer than the second distance, and an outer flange integral with said outer sidewall and extending outwardly therefrom, said outer flange being configured to extend beyond an internal vacuum region of a process chamber and into a space at atmospheric pressure.

7. The chamber liner of claim 6, wherein the inner and outer sidewalls are substantially perpendicular to the plasma confinement shield.

8. The chamber liner of claim 6, wherein the inner sidewall includes an inner flange that extends inwardly in a direction substantially opposite to the direction in which the outer flange extends.

9. The chamber liner of claim 6, wherein the chamber liner is comprised of anodized aluminum, and upper and lower surfaces of the outer flange have areas for contacting RF gaskets that are substantially free of anodization.

10. A chamber liner, comprising:

an annular plasma confinement shield having a plurality of apertures, a cylindrical outer sidewall extending upwardly from said plasma confinement shield for a first distance, a cylindrical inner sidewall extending upwardly from said plasma confinement shield for a second distance, the first distance being longer than the second distance, and an outer flange extending outwardly from said outer sidewall.

11. The chamber liner of claim 1, wherein the plasma confinement shield, the inner and outer sidewalls, and the outer flange are integral with one another.

12. The chamber liner of claim 10, wherein the inner and outer sidewalls are substantially perpendicular to the plasma confinement shield.

13. The chamber liner of claim 10, wherein the inner sidewall includes an inner flange that extends inwardly in a direction substantially opposite to the direction in which the outer flange extends.

14. The chamber liner of claim 10, wherein the chamber liner is comprised of anodized aluminum.

15. The chamber liner of claim 14, wherein upper and lower surfaces of the outer flange have portions for contacting RF gaskets that substantially free of anodization.

* * * * *